(12) United States Patent
Kapoor et al.

(10) Patent No.: US 11,475,281 B2
(45) Date of Patent: Oct. 18, 2022

(54) ELECTRONIC APPARATUS AND CONTROL METHOD THEREOF

(71) Applicant: SAMSUNG ELECTRONICS CO., LTD., Suwon-si (KR)

(72) Inventors: Parichay Kapoor, Suwon-si (KR); Saehyung Lee, Seoul (KR); Dongsoo Lee, Suwon-si (KR); Byeoungwook Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 639 days.

(21) Appl. No.: 16/555,331

(22) Filed: Aug. 29, 2019

(65) Prior Publication Data

US 2020/0074283 A1 Mar. 5, 2020

(30) Foreign Application Priority Data

Aug. 30, 2018 (KR) ........................ 10-2018-0102647

(51) Int. Cl.
| | | |
|---|---|---|
| *G06N 3/06* | (2006.01) | |
| *G06N 3/08* | (2006.01) | |
| *G06F 11/30* | (2006.01) | |
| *G06N 20/00* | (2019.01) | |
| *H03M 7/30* | (2006.01) | |
| *H03M 13/00* | (2006.01) | |

(52) U.S. Cl.
CPC ........... *G06N 3/06* (2013.01); *G06F 11/3024* (2013.01); *G06N 3/08* (2013.01); *G06N 20/00* (2019.01); *H03M 7/3059* (2013.01); *H03M 7/3077* (2013.01); *H03M 7/6041* (2013.01); *G06F 2212/454* (2013.01); *H03M 13/6312* (2013.01)

(58) Field of Classification Search
CPC ............. H03M 1/6312; H03M 7/6041; H03M 7/3077; H03M 7/3059; G06N 3/06; G06N 3/08
See application file for complete search history.

(56) References Cited

U.S. PATENT DOCUMENTS

| | | | |
|---|---|---|---|
| 5,016,211 A | 5/1991 | Jeong | |
| 5,204,899 A * | 4/1993 | Israelsen | ................ H04N 19/94 |
| | | | 375/240.18 |
| 5,359,700 A | 10/1994 | Seligson | |

(Continued)

FOREIGN PATENT DOCUMENTS

KR 10-2018-0043172 A 4/2018

OTHER PUBLICATIONS

International Search Report (PCT/ISA/210) dated Dec. 18, 2019 issued by the International Searching Authority in International Application No. PCT/KR2019/010988.

(Continued)

*Primary Examiner* — Lam T Mai
(74) *Attorney, Agent, or Firm* — Sughrue Mion, PLLC

(57) ABSTRACT

An electronic apparatus is provided. The electronic apparatus includes a storage storing a matrix included in an artificial intelligence model, and a processor. The processor divides data included in at least a portion of the matrix by one of rows and columns of the matrix to form groups, clusters the groups into clusters based on data included in each of the groups, and quantizes data divided by the other one of rows and columns of the matrix among data included in each of the clusters.

19 Claims, 29 Drawing Sheets

(56) References Cited

U.S. PATENT DOCUMENTS

| | | | |
|---|---|---|---|
| 2008/0266151 A1* | 10/2008 | Sankaran | H04N 19/423 341/107 |
| 2013/0336594 A1 | 12/2013 | Dorairaj | |
| 2015/0347927 A1 | 12/2015 | Zhang et al. | |
| 2018/0046894 A1 | 2/2018 | Yao | |
| 2018/0095632 A1* | 4/2018 | Leeman-Munk | G06N 3/0454 |
| 2018/0107925 A1 | 4/2018 | Choi et al. | |
| 2018/0107926 A1 | 4/2018 | Choi et al. | |
| 2018/0121796 A1 | 5/2018 | Deisher et al. | |
| 2018/0260379 A1* | 9/2018 | Yu | G06N 3/08 |
| 2019/0042927 A1* | 2/2019 | Keskin | G06F 17/16 |
| 2019/0281310 A1* | 9/2019 | Lee | G06V 10/82 |
| 2020/0074283 A1* | 3/2020 | Kapoor | G06F 11/3024 |
| 2020/0104098 A1* | 4/2020 | Bajic | G06F 7/49947 |
| 2020/0234131 A1* | 7/2020 | Lee | G06N 3/082 |
| 2021/0279589 A1* | 9/2021 | Lee | G06N 3/082 |

OTHER PUBLICATIONS

Written Opinion (PCT/ISA/237) dated Dec. 18, 2019 issued by the International Searching Authority in International Application No. PCT/KR2019/010988.

Julian Faraone et al., "SYQ: Learning Symmetric Quantization for Efficient Deep Neural Networks", 2018 IEEE/CVF Conference on Computer Vision and Pattern Recognition, IEEE, Computer Society, Jun. 18, 2018, pp. 4300-4309, XP033476403.

Communication dated Apr. 22, 2021 issued by the European Patent Office in European Application No. 19855239.0.

Chen Xu et al. "Alternating Multi-bit Quantization for Recurrent Neural Networks" ICLR 2018, Apr. 30-May 3, 2018, (pp. 1-13).

Matthieu Courbariaux et al. "BinaryConnect: Training Deep Neural Networks with binary weights during propagations" NIPS 2015, Dec. 7-12, 2015, (pp. 1-9).

Itay Hubara et al. "Quantized Neural Networks: Training Neural Networks with Low Precision Weights and Activations" Journal of Machine Learning Research, vol. 18, Apr. 2018, (pp. 1-30).

Mark D. McDonnell et al. "Training wide residual networks for deployment using a single bit for each weight" ICLR 2018, Apr. 30-May 3, 2018, (pp. 1-16).

Mohammad Rastegari et al. "XNOR-Net: ImageNet Classification Using Binary Convolutional Neural Networks" ECCV 2016, Oct. 8-16, 2016, (pp. 1-17).

* cited by examiner

FIG. 2B $$\begin{bmatrix} W_{11} & W_{12} & W_{13} & \cdots & W_{1n} \\ W_{21} & & & & W_{2n} \\ W_{31} & & \ddots & & W_{3n} \\ \vdots & & & & \vdots \\ W_{m1} & W_{m2} & W_{m3} & \cdots & W_{mn} \end{bmatrix}$$

FIG. 3B $$\sqrt{(a-e)^2 + (b-f)^2 + (c-g)^2 + (d-h)^2}$$

FIG. 7A $$\begin{bmatrix} W_{11} \\ W_{12} \\ W_{13} \end{bmatrix} \begin{bmatrix} a \\ b \\ c \end{bmatrix} = \begin{bmatrix} X \\ Y \\ Z \end{bmatrix}$$

$$\begin{bmatrix} W_{21} \\ W_{22} \\ W_{23} \end{bmatrix} \begin{bmatrix} X \\ Y \\ Z \end{bmatrix} = \begin{bmatrix} A \\ B \\ C \end{bmatrix}$$

FIG. 7B $$\begin{bmatrix} W_{11} \\ W_{13} \\ W_{12} \end{bmatrix} \begin{bmatrix} a \\ b \\ c \end{bmatrix} = \begin{bmatrix} X \\ Z \\ Y \end{bmatrix}$$

$$\begin{bmatrix} X \\ Y \\ Z \end{bmatrix}$$

$$\begin{bmatrix} W_{21} \\ W_{22} \\ W_{23} \end{bmatrix} \begin{bmatrix} X \\ Y \\ Z \end{bmatrix} = \begin{bmatrix} A \\ B \\ C \end{bmatrix}$$

FIG. 8A $$\begin{bmatrix} a & b & c & d & e & f & g & h & i & j \\ k & l & m & n & o & p & q & r & s & t \\ & & & & \vdots & & & & & \end{bmatrix} \begin{bmatrix} X_1 \\ X_2 \\ \vdots \\ X_{10} \end{bmatrix}$$

FIG. 8B $$\begin{bmatrix} a & b & c & d & e \\ k & l & m & n & o \\ & & \vdots & & \end{bmatrix} \begin{bmatrix} X_1 \\ X_2 \\ \vdots \\ X_5 \end{bmatrix}$$

$$\begin{bmatrix} f & g & h & i & j \\ p & q & r & s & t \\ & & \vdots & & \end{bmatrix} \begin{bmatrix} X_6 \\ X_7 \\ \vdots \\ X_{10} \end{bmatrix} \longrightarrow \oplus$$

FIG. 9A

| WER(word error rate, %) |||||| Tables |
|---|---|---|---|---|---|---|
| original | Bits ||||| |
| 9.12 | 1 | 2 | 3 | 4 | 5 | |
| | 93.87 | 13.2 | 9.94 | 9.38 | 9.23 | 1 |
| | 79.6 | 12.16 | 9.77 | 9.42 | 9.16 | 2 |
| | 66.64 | 11.74 | 9.65 | 9.32 | 9.19 | 3 |
| | 62.39 | 11.02 | 9.56 | 9.25 | 9.14 | 4 |
| | 61.93 | 10.87 | 9.52 | 9.3 | 9.16 | 5 |
| | 56.39 | 10.71 | 9.56 | 9.29 | 9.14 | 6 |
| | 49.1 | 10.83 | 9.48 | 9.19 | 9.13 | 7 |
| | 46.11 | 10.58 | 9.45 | 9.23 | 9.13 | 8 |

FIG. 9B

| WER(word error rate, %) | | | | | | Tables |
|---|---|---|---|---|---|---|
| original | Bits | | | | | |
| 9.12 | 1 | 2 | 3 | 4 | 5 | |
| | 93.87 | 13.2 | 9.94 | 9.38 | 9.23 | 1 |
| | 78.43 | 11.74 | 9.64 | 9.4 | 9.17 | 2 |
| | 61.93 | 11.35 | 9.66 | 9.26 | 9.19 | 3 |
| | 58.45 | 10.95 | 9.57 | 9.27 | 9.14 | 4 |
| | 54.18 | 10.94 | 9.52 | 9.23 | 9.16 | 5 |
| | 47.06 | 10.72 | 9.39 | 9.2 | 9.17 | 6 |
| | 43.38 | 10.68 | 9.41 | 9.12 | 9.16 | 7 |
| | 43.16 | 10.45 | 9.44 | 9.23 | 9.14 | 8 |

FIG. 9C

| Num of tables | Accuracy without Kmeans | Accuracy with Kmeans |
|---|---|---|
| 8 | 88.67 | 89.15 |
| 16 | 89.88 | 90.32 |
| 24 | 90.5 | 91.03 |

ELECTRONIC APPARATUS AND CONTROL METHOD THEREOF

CROSS-REFERENCE TO RELATED APPLICATION(S)

This application is based on and claims priority under 35 U.S.C. § 119(a) of a Korean Patent Application No. 10-2018-0102647, filed on Aug. 30, 2018, in the Korean Intellectual Property Office, the disclosure of which is incorporated by reference herein in its entirety.

BACKGROUND

1. Field

The disclosure relates to an electronic apparatus for compressing an artificial intelligence model and a control method thereof, in an artificial intelligence (AI) system simulating functions of a human brain such as cognition and determination by using a machine learning algorithm such as deep learning and application thereof, and more particularly, to an electronic apparatus for quantizing an artificial intelligence model, and a control method thereof.

2. Description of Related Art

Recently, artificial intelligence systems implementing intelligence of a human level are being used in various fields. An artificial intelligence system refers to a system wherein a machine learns, determines, and becomes smarter by itself, unlike conventional rule-based smart systems. An artificial intelligence system shows a more improved recognition rate as it is used more, and becomes capable of understanding user preference more correctly. For this reason, conventional rule-based smart systems are gradually being replaced by deep learning-based artificial intelligence systems.

An artificial intelligence technology consists of machine learning (for example, deep learning) and element technologies utilizing machine learning.

Machine learning refers to an algorithm technology of classifying/learning the characteristics of input data by itself, and an element technology refers to a technology of simulating functions of a human brain such as cognition and determination by using a machine learning algorithm such as deep learning, and includes fields of technologies such as linguistic understanding, visual understanding, inference/prediction, knowledge representation, and operation control.

Examples of various fields to which artificial intelligence technologies are applied are as follows. Linguistic understanding refers to a technology of recognizing languages/characters of humans, and applying/processing the languages/characters, and includes natural speech processing, machine translation, communication systems, queries and answers, voice recognition/synthesis, and the like. Visual understanding refers to a technology of recognizing an object in a similar manner to human vision, and processing the object, and includes recognition of an object, tracking of an object, search of an image, recognition of humans, understanding of a scene, understanding of a space, improvement of an image, and the like. Inference/prediction refers to a technology of determining information and then making logical inference and prediction, and includes knowledge/probability based inference, optimization prediction, preference based planning, recommendation, and the like. Knowledge representation refers to a technology of automatically processing information of human experiences into knowledge data, and includes knowledge construction (data generation/classification), knowledge management (data utilization), and the like. Operation control refers to a technology of controlling autonomous driving of vehicles and movements of robots, and includes movement control (navigation, collision, driving), operation control (behavior control), and the like.

Meanwhile, an artificial intelligence model has problems in that the artificial intelligence model requires vast amounts of data, and thus a memory of high capacity for storing data is needed, and in that there is a delay in operations and the amount of energy consumption is high. In contrast, in the case of quantizing an artificial intelligence model, data capacity may be reduced, but there is a problem that the performance of the artificial intelligence model deteriorates.

SUMMARY

Provided is an electronic apparatus which may reduce the data capacity of an artificial intelligence model while minimizing deterioration in performance, and a control method thereof.

Additional aspects will be set forth in part in the description which follows and, in part, will be apparent from the description, or may be learned by practice of the presented embodiments.

According to an aspect of an embodiment, there is provided an electronic apparatus comprising a storage storing a matrix included in an artificial intelligence model; and a processor configured to divide data included in at least a portion of the matrix by one of rows and columns of the matrix to form a plurality of groups, cluster the plurality of groups into a plurality of clusters based on data included in each of the plurality of groups, and quantize data divided by the other one of rows and columns of the matrix among data included in each of the plurality of clusters.

At least one representative value may be acquired based on a size of first data included in a first group and a size of second data included in a second group among groups included in each of the plurality of clusters, and each of the first data and the second data may be converted into a binary code based on the at least one representative value, and each of the first data and the second data may be quantized, and the second data may be data in which the other one of rows and columns of the matrix is a same as that of the first data.

The processor may determine a number of the at least one representative value based on a number of the plurality of groups included in each of the plurality of clusters.

The processor may map each of the plurality of groups in a multi-dimensional space based on data included in each of the plurality of groups, and cluster the plurality of groups into the plurality of clusters based on a distance among the groups in the multi-dimensional space.

The processor may cluster the plurality of groups into the plurality of clusters based on a K-means algorithm.

The processor may, based on acquiring output data for input data based on the quantized matrix, realign the output data based on clustering information, and the clustering information may be acquired based on an operation of clustering the plurality of groups into the plurality of clusters.

The at least portion of the matrix may be a sub area of the matrix determined based on the other one of rows and columns of the matrix.

According to another aspect of an embodiment, there is provided a control method comprising dividing data included in at least a portion of a matrix included in an artificial intelligence model by one of rows and columns of the matrix to form a plurality of groups; clustering the plurality of groups into a plurality of clusters based on data included in each of the plurality of groups; and quantizing data divided by the other one of rows and columns of the matrix among data included in each of the plurality of clusters.

The quantizing may comprise acquiring at least one representative value based on a size of first data included in a first group and a size of second data included in a second group among groups included in each of the plurality of clusters, and converting each of the first data and the second data into a binary code based on the at least one representative value, and quantizing each of the first data and the second data, and the second data may be data wherein the other one of rows and columns of the matrix is a same as that of the first data.

The quantizing may comprise determining a number of the at least one representative value based on a number of the plurality of groups included in each of the plurality of clusters.

The clustering may comprise mapping each of the plurality of groups in a multi-dimensional space based on data included in each of the plurality of groups, and clustering the plurality of groups into the plurality of clusters based on a distance among the groups in the multi-dimensional space.

The clustering may comprise clustering the plurality of groups into the plurality of clusters based on a K-means algorithm.

The control method may further comprise, based on acquiring output data for input data based on the quantized matrix, realigning the output data based on clustering information, and the clustering information may be acquired based on an operation of clustering the plurality of groups into the plurality of clusters.

The at least portion of the matrix may be a sub area of the matrix determined based on the other one of rows and columns of the matrix.

According to another aspect of an embodiment, there is provided a non-transitory computer-readable recording medium storing a program which, when executed by an electronic apparatus, performs an operating method comprising dividing data included in a portion of a matrix included in an artificial intelligence model by one of rows and columns of the matrix to form a plurality of groups; clustering the plurality of groups into a plurality of clusters based on data included in each of the plurality of groups; and quantizing data divided by the other one of rows and columns of the matrix among data included in each of the plurality of clusters.

According to another aspect of an embodiment, there is provided an electronic apparatus comprising a storage storing a matrix included in an artificial intelligence model; and a processor configured to divide data in the matrix by rows to form a plurality of groups of data, cluster the plurality of groups into a first cluster and a second cluster based on data included in the plurality of groups, and quantize the data in the first cluster by columns according to a representative value determined for each column according to the data in the column, and quantize the data in the second cluster by columns according to a representative value determined for each column according to the data in the column.

The processor may cluster the plurality of groups into the plurality of clusters by reordering at least one of the groups based on the data included in the plurality of groups.

The representative values for each column of the first cluster may be different from one another, and the representative values for each column of the second cluster may be different from one another.

To quantize data in the first cluster, data from at least two columns may be combined, and the combined data may be quantized with one representative value.

A number of the representative values may be determined based on a threshold accuracy and/or a threshold quantization error.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 2B is a diagram for illustrating an artificial intelligence model according to an embodiment;

FIG. 3B is a diagram for illustrating a clustering method according to an embodiment;

FIG. 7A is a diagram for illustrating an additional operation according to clustering according to an embodiment;

FIG. 7B is a diagram for illustrating an additional operation according to clustering according to an embodiment;

FIG. 8A is a diagram for illustrating a method of dividing a matrix and quantizing the matrix according to an embodiment;

FIG. 8B is a diagram for illustrating a method of dividing a matrix and quantizing the matrix according to an embodiment;

FIG. 9A is a diagram for illustrating a word error rate (WER) and accuracy according to an embodiment;

FIG. 9B is a diagram for illustrating a word error rate (WER) and accuracy according to an embodiment;

FIG. 9C is a diagram for illustrating a word error rate (WER) and accuracy according to an embodiment;

DETAILED DESCRIPTION

Figure 1A:
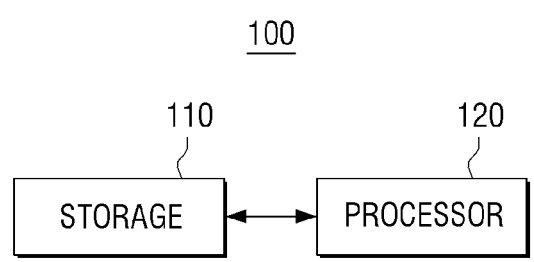
FIG. 1A is a block diagram illustrating a configuration of an electronic apparatus according to an embodiment.

The exemplary embodiments of the present disclosure may be diversely modified. Accordingly, specific exemplary embodiments are illustrated in the drawings and are described in detail in the detailed description. However, it is to be understood that the present disclosure is not limited to a specific exemplary embodiment, but includes all modifications, equivalents, and substitutions without departing from the scope and spirit of the present disclosure. Also, well-known functions or constructions are not described in detail since they would obscure the disclosure with unnecessary detail. As used herein, the terms "1st" or "first" and "2nd" or "second" may use corresponding components regardless of importance or order and are used to distinguish one component from another without limiting the components.

Hereinafter, various embodiments of the disclosure will be described in detail with reference to the accompanying drawings.

FIG. 1A is a block diagram illustrating a configuration of an electronic apparatus 100 according to an embodiment of the disclosure. As illustrated in FIG. 1A, the electronic apparatus 100 includes a storage 110 and a processor 120.

The electronic apparatus 100 may be an apparatus that quantizes an artificial intelligence model. For example, the electronic apparatus 100 is an apparatus that quantizes a matrix included in an artificial intelligence model, and the electronic apparatus 100 may be a server, a desktop PC, a laptop computer, a smartphone, a tablet PC, etc. Also, in an artificial intelligence model, a plurality of matrices may be included, and the electronic apparatus 100 may quantize some or all of the plurality of matrices. That is, the electronic apparatus 100 may be any apparatus that may reduce the size of data of an artificial intelligence model by quantizing the artificial intelligence model. Here, a matrix may be, for example, a weight matrix.

The storage 110 is provided separately from the processor 120, and the storage 110 may be implemented as, for example, a hard disk, a non-volatile memory, a volatile memory, etc.

The storage 110 may store a matrix included in an artificial intelligence model. Here, the matrix may be, for example, filter data, kernel data, etc. constituting the artificial intelligence model. Also, the storage 110 may store a plurality of matrices included in the artificial intelligence model.

Alternatively, the storage 110 may store data that may be used for the artificial intelligence model, and the processor 120 may identify the data stored in the storage 110 as a matrix.

The processor 120 controls the overall operations of the electronic apparatus 100.

According to an embodiment of the disclosure, the processor 120 may be implemented as a digital signal processor (DSP), a microprocessor, and/or a time controller (TCON). However, the disclosure is not limited thereto, and the processor 120 may include one or more of a central processing unit (CPU), a micro controller unit (MCU), a micro processing unit (MPU), a controller, an application processor (AP) or a communication processor (CP), and an ARM processor. In some embodiments, the processor 120 may include plural components of any of the above working in cooperation with each other. Also, the processor 120 may be implemented as a system on chip (SoC) having a processing algorithm stored therein or large scale integration (LSI), or in the form of a field programmable gate array (FPGA).

The processor 120 may divide data included in at least a portion of the matrix by a unit of one of rows and columns of the matrix and identify the divided data as a plurality of groups, cluster the plurality of groups into a plurality of clusters based on data included in each of the plurality of groups, and quantize data divided by a unit of the other of rows and columns of the matrix among data included in each of the plurality of clusters.

For example, the processor 120 may identify data included in a 4×4 matrix as four 1×4 groups based on the rows of the matrix. Hereinafter, for the convenience of explanation, the 1×4 group in the first row of the 4×4 matrix will be described as a first group, the 1×4 group in the second row will be described as a second group, the 1×4 group in the third row will be described as a third group, and the 1×4 group in the fourth row will be described as a fourth group.

Then, the processor 120 may cluster the four groups into two clusters based on data included in each group. For example, the processor 120 may cluster the first group and the third group among the four groups as a first cluster, and the second group and the fourth group as a second cluster.

Then, the processor 120 may quantize data included in the same column among data included in a plurality of groups included in each cluster. Here, the standard for performing quantization may be different from the standard for identifying groups. For example, in case the processor 120 divides data included in at least a portion of the matrix by the unit of "columns" of the matrix and identifies the divided data as a plurality of groups, the processor 120 may quantize data pairs included in the same "row" among data included in a plurality of groups included in each cluster. Alternatively, in case the processor 120 divides data included in at least a portion of the matrix by the unit of "rows" of the matrix and identifies the divided data as a plurality of groups, the processor 120 may quantize data pairs included in the same "column" among data included in a plurality of groups included in each cluster.

Explaining the method of quantization in detail, the processor 120 may acquire at least one representative value based on the size of first data included in the first group and the size of second data included in the second group among groups included in each of the plurality of clusters, and convert each of the first data and the second data into a binary code based on the at least one representative value, and quantize each of the first data and the second data. Meanwhile, the second data may be data wherein the other one of the rows and the columns of the matrix is the same as that of the first data.

In the aforementioned embodiment, the processor 120 may quantize the first data belonging to the first group clustered as the first cluster and the second data in the same column as the first data among the data belonging to the third group clustered as the first cluster. For example, the processor 120 may quantize the first data among the data belonging to the first 1×4 group clustered as the first cluster and the first data among the data belonging to the third 1×4 group clustered as the first cluster. Also, the processor 120 may quantize the second data among the data belonging to the first 1×4 group clustered as the first cluster and the second data among the data belonging to the third 1×4 group clustered as the first cluster.

By a method as above, the processor 120 may quantize the data belonging to the first group clustered as the first cluster and the data belonging to the third group clustered as the first cluster, and may quantize four pairs of data in total. By the same method, the processor 120 may quantize the data belonging to the second group clustered as the second cluster and the data belonging to the fourth group clustered as the second cluster, and may quantize four pairs of data in total. Thus, the processor 120 may quantize eight pairs of data in total for quantizing the plurality of groups.

The processor 120 may quantize the first data and the second data based on the sizes of the first data and the second data. For example, if the first data is 3, and the second data is −1, the processor 120 may set the representative value as 2, and set the first data as 1, and set the second data as −1. That is, the processor 120 may set the first data 3 as 1, and at the time of restoration later, may restore the first data 3 to 2 by using the representative value 2 and set the second data −1 as −1, and at the time of restoration later, may restore the second data −1 to −2 by using the representative value 2. Accordingly, a quantization error may occur as the first data is expressed as 2 from 3, and the second data is expressed as −2 from −1. Meanwhile, if each data included in the matrix has 32 bits, 64 bits in total are needed for expressing the first data and the second data, but after quantization in 1 bit, only the representative value 32 bits and the first data of 1 bit converted into a binary code, and the second data of 1 bit converted into a binary code are needed, and thus 34 bits in total are needed. That is, it is possible to reduce data capacity.

Meanwhile, the processor 120 may determine the number of at least one representative value based on the number of a plurality of groups included in each of a plurality of clusters. In the aforementioned embodiment, two groups are included in the first cluster, and thus quantization was performed with one representative value. However, if there are 10 groups included in a cluster, 10 data should be quantized, and in this case, if quantization is performed with one representative value, the quantization error becomes very big. Accordingly, the processor 120 may increase the number of representative values as there are more groups included in a cluster.

The processor 120 may identify whether a threshold accuracy is maintained while changing the number of representative values, and determine the smallest number among the numbers of representative values by which the threshold accuracy is maintained as the number of representative values. For example, the processor 120 may adjust the number of representative values under a condition that the accuracy after quantization is maintained as 90% of the accuracy before quantization. As an example, in case quantization is performed with the number of representative values as five, the processor 120 may increase the number of representative values if the accuracy after quantization is less than 90% of the accuracy before quantization, and decrease the number of representative values if the accuracy after quantization is equal to or higher than 90% of the accuracy before quantization. The processor 120 may repeat this process, and determine that the accuracy after quantization is maintained as equal to or higher than 90% of the accuracy before quantization in case the number of representative values is equal to or bigger than 7, and determine the number of representative values as 7.

Meanwhile, the processor 120 may map each of the plurality of groups in a multi-dimensional space based on data included in each of the plurality of groups, and cluster the plurality of groups into a plurality of clusters based on the distance among the groups in the multi-dimensional space. For example, the processor 120 may cluster the plurality of groups into a plurality of clusters by applying a K-means algorithm to data included in each of the plurality of groups. However, the disclosure is not limited thereto, and the processor 120 may cluster the plurality of groups into a plurality of clusters by numerous different methods.

Meanwhile, if output data for input data is acquired based on the quantized matrix, the processor 120 may realign the output data based on clustering information. The clustering information may be information acquired based on an operation of clustering the plurality of groups into a plurality of clusters. Detailed explanation in this regard will be made with reference to FIGS. 7A and 7B.

Also, at least a portion of the matrix may be a sub area of the matrix identified based on the other one of the rows and the columns of the matrix. Detailed explanation in this regard will be made with reference to FIGS. 8A and 8B.

Figure 1B:
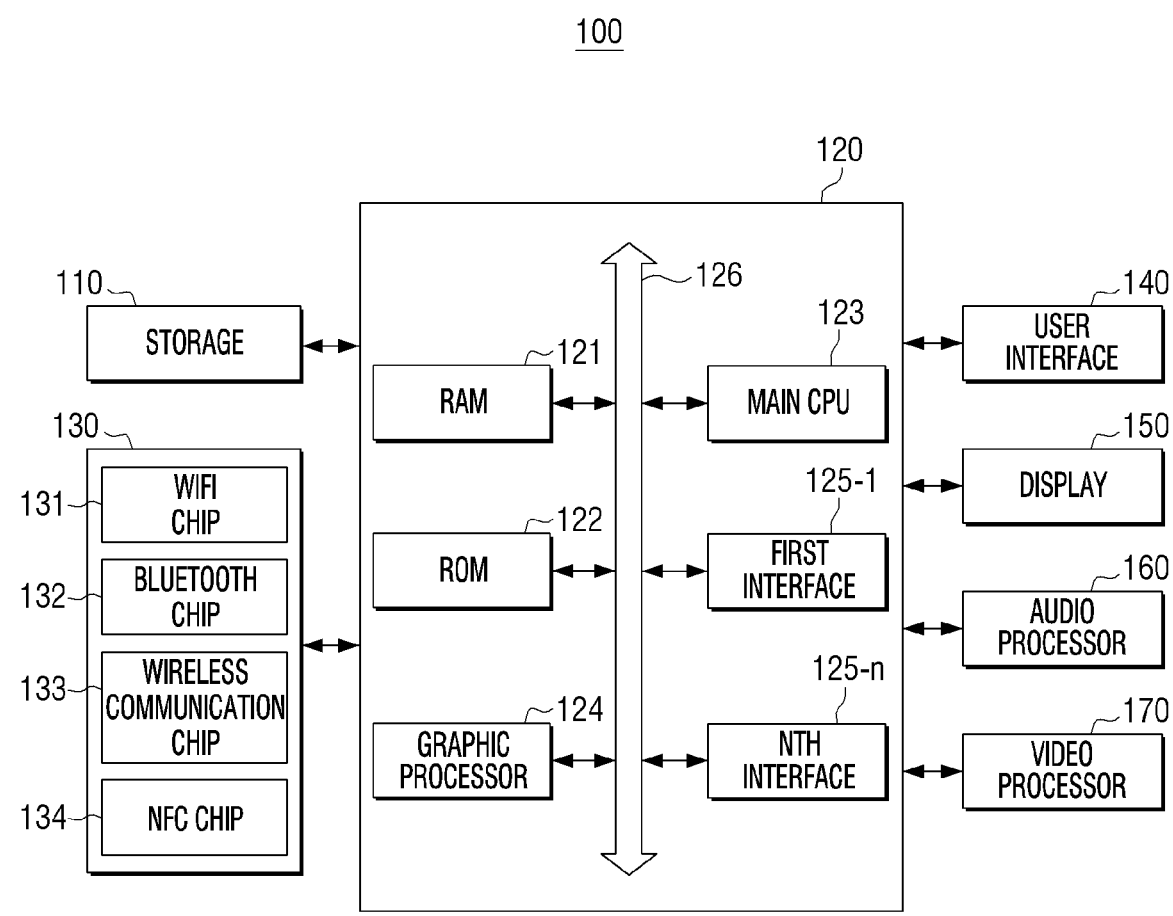
FIG. 1B is a block diagram illustrating a detailed configuration of an electronic apparatus according to an embodiment.

FIG. 1B is a block diagram illustrating a detailed configuration of an electronic apparatus 100 according to an embodiment of the disclosure. According to FIG. 1B, the electronic apparatus 100 includes a storage 110, a processor 120, a communicator 130, a user interface 140, a display 150, an audio processor 160, and a video processor 170. Meanwhile, among the components illustrated in FIG. 1B, regarding the components overlapping with the components illustrated in FIG. 1A, detailed explanation will be omitted for conciseness.

The processor 120 controls the overall operations of the electronic apparatus 100 by using various programs stored in the storage 110.

Specifically, the processor 120 includes a RAM 121, a ROM 122, a main CPU 123, a graphic processor 124, first to nth interfaces 125-1~125-n, and a bus 126.

The RAM 121, the ROM 122, the main CPU 123, the graphic processor 124, the first to nth interfaces 125-1~125-n, etc. may be connected with one another through the bus 126.

The first to nth interfaces 125-1~125-n are connected with the aforementioned various components. One of the interfaces may be a network interface connected with an external apparatus through a network.

The main CPU 123 accesses the storage 110, and executes booting by using the O/S stored in the storage 110. Then, the main CPU 123 performs various operations by using various programs, etc. stored in the storage 110.

The ROM 122 stores a set of instructions, etc. for system booting. When a turn-on instruction is input and power is supplied, the main CPU 123 copies the O/S stored in the storage 110 in the RAM 121 according to the instruction stored in the ROM 122, and boots the system by executing the O/S. When booting is completed, the main CPU 123 copies the various types of application programs stored in the storage 110 in the RAM 121, and performs various types of operations by executing the application programs copied in the RAM 121.

The graphic processor 124 generates a screen including various objects like icons, images, and texts by using an operation part (not shown) and a rendering part (not shown). The operation part (not shown) operates attribute values such as coordinate values, shapes, sizes, and colors by which each object will be displayed according to the layout of the screen based on a received control command. Also, the rendering part (not shown) generates screens in various layouts including objects, based on the attribute values operated at the operation part (not shown). The screens generated at the rending part (not shown) are displayed in the display area of the display 150.

Meanwhile, the aforementioned operation of the processor 120 may be performed by a program stored in the storage 110.

The storage 110 stores various data like an operating system (O/S) software module for operating the electronic apparatus 100, an artificial intelligence module including an artificial intelligence model and a quantized artificial intelligence model, a quantization module for quantizing an artificial intelligence model, etc.

The communicator 130 is a component performing communication with various types of external apparatuses according to various types of communication methods. The communicator 130 includes a WiFi chip 131, a Bluetooth chip 132, a wireless communication chip 133, an NFC chip 134, etc. The processor 120 performs communication with various types of external apparatuses by using the communicator 130.

The WiFi chip 131 and the Bluetooth chip 132 perform communication by using a WiFi method and a Bluetooth method, respectively. In the case of using the WiFi chip 131 or the Bluetooth chip 132, various types of connection information such as an SSID and a session key is transmitted and received first, and connection of communication is performed by using the information, and various types of information may be transmitted and received thereafter. The wireless communication chip 133 refers to a chip performing communication according to various communication standards such as IEEE, Zigbee, 3rd Generation (3G), 3rd Generation Partnership Project (3GPP), and Long Term Evolution (LTE). Meanwhile, the NFC chip 134 refers to a chip that operates in a near field communication (NFC) method using a 13.56 MHz band among various RF-ID frequency bands such as 135 kHz, 13.56 MHz, 433 MHz, 860~960 MHz, and 2.45 GHz.

The processor 120 may receive a matrix included in an artificial intelligence module or an artificial intelligence model from an external apparatus through the communicator 130, and store the received data in the storage 110. Alternatively, the processor 120 may generate an artificial intelligence model by itself through an artificial intelligence algorithm, and store the generated artificial intelligence model in the storage 110. Here, an artificial intelligence model may include a matrix.

The user interface 140 receives various user interactions. Here, the user interface 140 may be implemented in various forms according to implementation embodiments of the electronic apparatus 100. For example, the user interface 140 may be a button provided on the electronic apparatus 100, a microphone receiving a user voice, a camera detecting a user motion, etc. Alternatively, in case the electronic apparatus 100 is implemented as an electronic apparatus based on touches, the user interface 140 may be implemented in the form of a touch screen that constitutes an inter-layer structure with a touch pad. In this case, the user interface 140 may be used as the aforementioned display 150.

The audio processor 160 is a component performing processing of audio data. At the audio processor 160, various types of processing such as decoding or amplification, noise filtering, etc. of audio data may be performed.

The video processor 170 is a component performing processing of video data. At the video processor 170, various types of image processing such as decoding, scaling, noise filtering, frame rate conversion, and resolution conversion of video data may be performed.

Through a method as above, the processor 120 may quantize a matrix included in an artificial intelligence model.

Hereinafter, operations of the electronic apparatus 100 will be described in more detail with reference to the drawings.

Figure 2A:
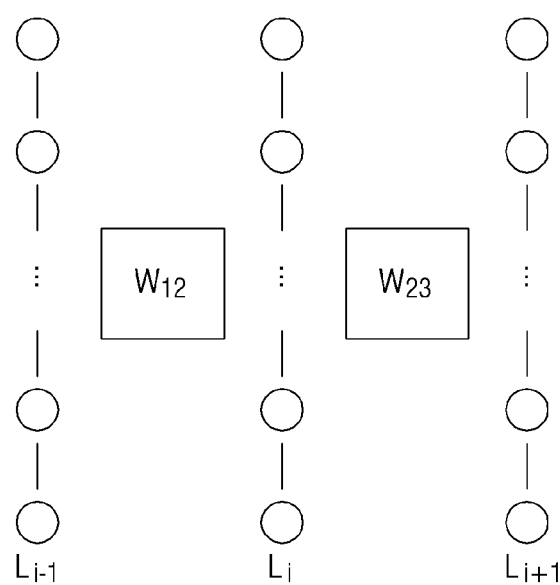
FIG. 2A is a diagram for illustrating an artificial intelligence model according to an embodiment.

FIGS. 2A and 2B are diagrams for illustrating an artificial intelligence model according to an embodiment of the disclosure.

FIG. 2A is a drawing illustrating an embodiment of an artificial intelligence model including three layers and two matrices, and the processor 120 may acquire the median values of Li by inputting the input values of Li−1 into $W_{12}$, and acquire the final values of Li+1 by inputting the median values of Li into $W_{23}$. However, FIG. 2A illustrates an artificial intelligence model schematically, and in actuality, more layers than the three layers and more matrices than two matrices than in FIG. 2A may be included.

FIG. 2B is a drawing illustrating an embodiment of a matrix, and the matrix may be in the form of m×n. For example, the matrix may be in the form of 10000×8000. Also, data in the matrix may be 32 bits, respectively. That is, the matrix may include 10000×8000 data of 32 bits each. However, the disclosure is not limited thereto, and the size of the matrix and the number of bits of each data may vary in numerous ways.

As illustrated in FIGS. 2A and 2B, considering the size of each data included in the matrix, the number of data included in the matrix, and the number of matrices included in an artificial intelligence model, a very large storage space for storing an artificial intelligence model is needed, and a substantial amount of power may be consumed for operations of an artificial intelligence model. Accordingly, the processor 120 may quantize the data of the matrix, and thereby reduce the space necessary for storage, and decrease the amount of operations.

Figure 3A:
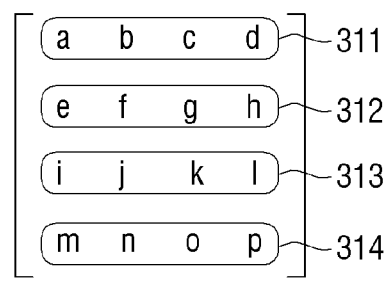
FIG. 3A is a diagram for illustrating a clustering method according to an embodiment.
Figure 3B:
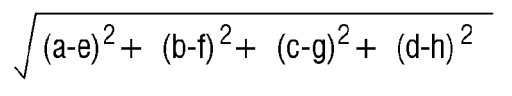
Figure 3C:
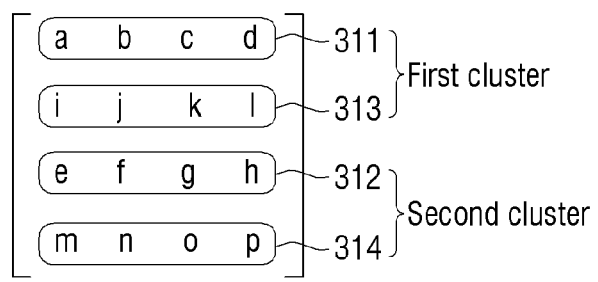
FIG. 3C is a diagram for illustrating a clustering method according to an embodiment.

FIGS. 3A to 3C are diagrams for illustrating a clustering method according to an embodiment of the disclosure.

First, in FIG. 3A, for the convenience of explanation, it is explained that a 4×4 matrix includes 16 data, and each data has 32 bits. For example, "a" may be one data having 32 bits, "b" may be another data having 32 bits, and so on.

The processor 120 may divide a 4×4 matrix by a unit of rows, and identify data included in the matrix as four groups 311~314.

Then, the processor 120 may map each of the four groups in a four-dimensional space, and calculate the distance among the groups in the four-dimensional space by a method as in FIG. 3B. Also, the processor 120 may cluster groups within a close distance. For example, the processor 120 may cluster the first group 311 and the third group 313 as the first cluster, and cluster the second group 312 and the fourth group 314 as the second cluster, as in FIG. 3C. Also, the processor 120 may change the locations of data in the matrix according to the clustering, as shown in FIG. 3C. Such an operation is called as reordering, and reordering does not influence the calculation amounts and accuracy. Hereinafter, for the convenience of explanation, it will be explained that reordering is included in a clustering operation.

However, the disclosure is not limited thereto, and the processor 120 may cluster the plurality of groups 311~314 into a plurality of clusters based on a K-means algorithm.

Also, the processor 120 may cluster the first group 311, the second group 312, and the third group 313 as the first cluster, and cluster the fourth group 314 as the second cluster.

Meanwhile, advantages according to clustering will be explained later.

Figure 4A:
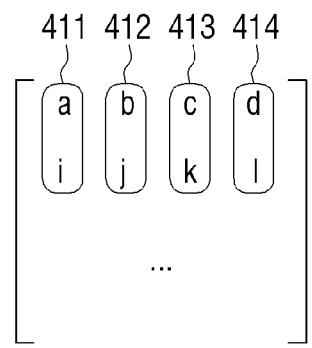
FIG. 4A is a diagram for illustrating a quantization method according to an embodiment.
Figure 4B:
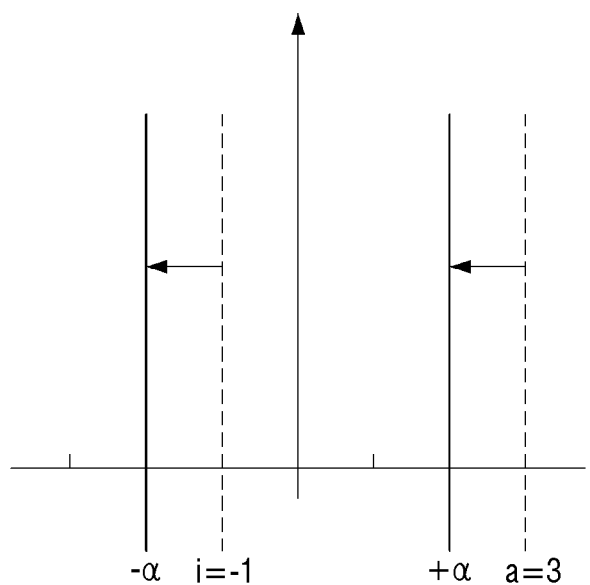
FIG. 4B is a diagram for illustrating a quantization method according to an embodiment.
Figure 4C:
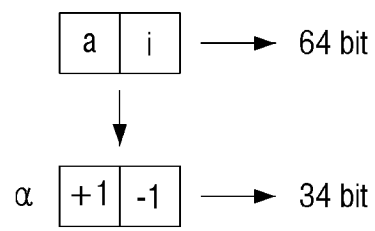
FIG. 4C is a diagram for illustrating a quantization method according to an embodiment.

FIGS. 4A to 4C are diagrams for illustrating a quantization method according to an embodiment of the disclosure.

In FIG. 4A, for the convenience of explanation, only data included in the first cluster including the first group 311 and the third group 313 of FIG. 3C is illustrated. As illustrated in FIG. 4A, the processor 120 may respectively quantize data pairs 411~414 including the first data of the first group 311 and the second data of the third group 313 among the data included in the first cluster.

For explaining the method of quantizing the first data pair 411, first, quantization in 1 bit for a case in which a is 3, and i is −1 is assumed. The processor 120 may acquire a representative value $\alpha$ based on a and i. For example, the processor 120 may acquire $\alpha$ by averaging the absolute value of a and the absolute value of i, and in the case of the aforementioned embodiment, $\alpha$ therefore may be 2. However, the disclosure is not limited thereto, and the processor 120 may acquire $\alpha$ by numerous different methods.

Then, as illustrated in FIG. 4B, the processor 120 may quantize a and i as +1 and −1 respectively, based on $\alpha$. That is, the processor 120 may convert a which is close to +$\alpha$ between +$\alpha$ and −$\alpha$ into +1, and convert i which is close to −$\alpha$ as −1. It is noted that the arrows in FIG. 4B are intended to indicate to which of +$\alpha$ and −$\alpha$ the values of a and i are closest.

As illustrated in FIG. 4C, the processor 120 may convert a and i into +1 and −1, and $\alpha$. According to the aforementioned embodiment, 3 may be quantized as 2, and −1 may be quantized as −2, and may be expressed as the representative value 2 and binary data 1 and −1. Also, the data of 64 bits in total of a and i, which are each 32 bits, may be converted into data of 34 bits in total of $\alpha$, including $\alpha$ which is 32 bits, and +1 and −1 which are 1 bit each.

The processor 120 may perform quantization for the second data pair 412, the third pair 413, and the fourth data pair 414 shown in FIG. 4A by the same method. Here, the representative values of the first data pair 411 to the fourth data pair 414 may be different from one another. However, the disclosure is not limited thereto, and the processor 120 may combine some data pairs and quantize the combined data pairs with one representative value. For example, the processor 120 may quantize the first data pair 411 and the second data pair 412 with one representative value. In this case, the processor 120 may convert data of 128 bits in total into data of 38 bits in total. However, in this case, the quantization error may become larger, and the accuracy of the artificial intelligence model may deteriorate. Accordingly, the processor 120 may perform quantization by combining a plurality of data pairs within a scope wherein the accuracy of the artificial intelligence model is maintained, and may thereby improve the efficiency of quantization. The number of data pairs to be combined may also be determined based on threshold accuracy.

The quantization method explained in FIGS. 4A to 4C may also be performed in the same manner with respect to the second cluster.

FIGS. 5A to 5E are diagrams for explaining a quantization method according to another embodiment of the disclosure.

Figure 5A:
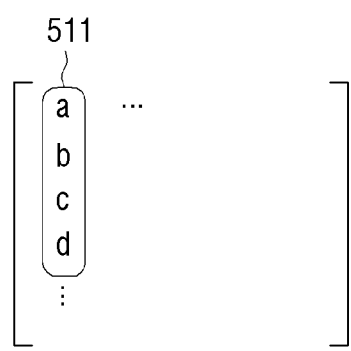
FIG. 5A is a diagram for illustrating a quantization method according to another embodiment of the disclosure.

In FIG. 5A, for the convenience of explanation, it was assumed that four groups are included in the first cluster. As illustrated in FIG. 5A, the processor 120 may quantize the data pair 511 included in the first column included in each group among the data included in the first cluster.

Figure 5B:
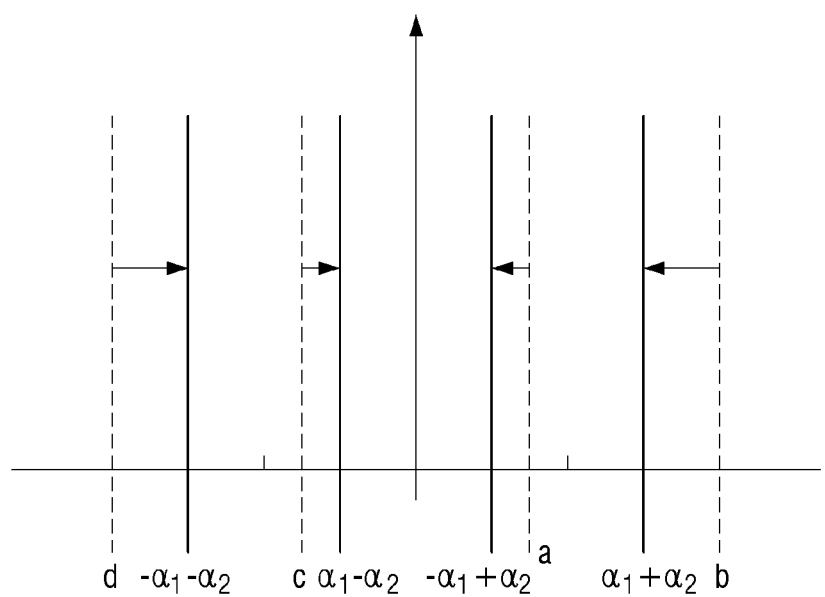
FIG. 5B is a diagram for illustrating a quantization method according to another embodiment of the disclosure.

The processor 120 may acquire representative values $\alpha1$ and $\alpha2$ when performing quantization of 2 bits based on a, b, c, d. Then, as illustrated in FIG. 5B, the processor 120 may convert a into $-\alpha1+\alpha2$, b into $\alpha1+\alpha2$, c into $\alpha-\alpha2$, and d into $-\alpha1-\alpha2$, based on $\alpha1$ and $\alpha2$.

Figure 5C:
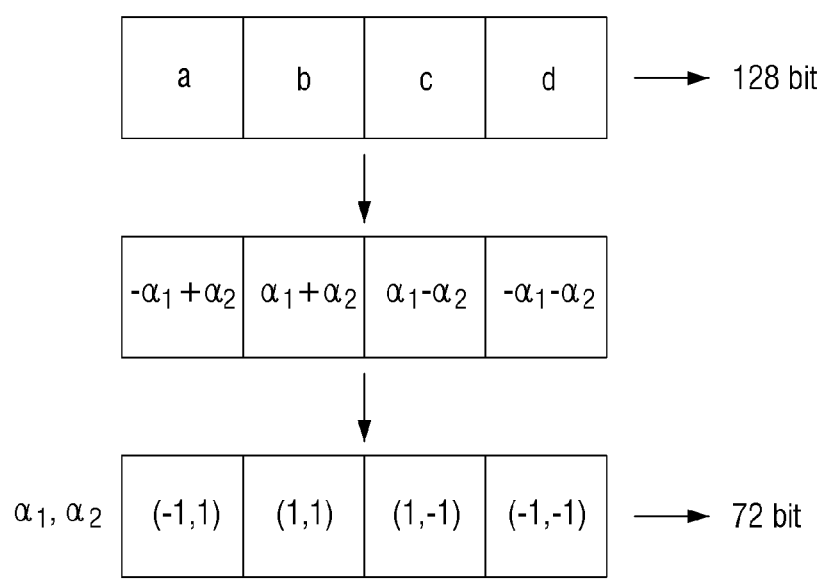
FIG. 5C is a diagram for illustrating a quantization method according to another embodiment of the disclosure.

Also, as illustrated in FIG. 5C, the processor 120 may convert a into (−1, 1), b into (1, 1), c into (1, −1), and d into (−1, −1). That is, the processor 120 may convert data of 128 bits in total of a, b, c, d, which are 32 bits each, into data of 72 bits in total of $\alpha1$ and $\alpha2$, which are 32 bits each and (−1, 1), (1, 1), (1, −1), (−1, −1) which are 2 bits each.

That is, since the processor 120 uses $\alpha1$ and $\alpha2$, the quantization error may be reduced more than a case of using $\alpha$.

Here, the number of representative values may be determined based on the number of groups included in clusters. That is, the processor 120 may increase the number of representative values when there are more groups included in clusters, and then perform quantization.

Alternatively, the processor 120 may identify whether a threshold accuracy is satisfied while increasing the number of representative values sequentially. For example, as in FIG. 5D, if 3, 7, −1, −5 are quantized, the processor 120 may first acquire one representative value based on the absolute values of each of 3, 7, −1, −5. In this case, the one representative value may be 4, and each of 3, 7, −1, −5 may be converted into binary data of 1, 1, −1, −1. Here, the entire quantization error may be the total length of the arrows in FIG. 5D, which is 8. That is, each of the right-pointing arrows has a length of 1, and each of the left-pointing arrows has a length of 3, such that 1+3+1+3==8.

If the entire quantization error is smaller than a threshold error, the processor 120 may perform quantization with one representative value, and if the entire quantization error is equal to or greater than a threshold error, the processor 120 may perform quantization again with two representative values. In the case of performing quantization again, the processor 120 may set the one representative value that was initially acquired as $\alpha1$, and acquire the average value of the quantization error between each of 3, 7, −1, −5 and $\alpha1$ as the representative value $\alpha2$. That is, the processor 120 may acquire the quantization error between each of 3, 7, −1, −5 and $\alpha1$ as 1, 3, 3, 1, and acquire the average value 2 of the quantization error as the representative value $\alpha2$. That is, $\alpha1$ may be 4 and $\alpha2$ may be 2. Then, as in FIG. 5E, the processor 120 may quantize 3, 7, −1, −5 as $\alpha1-\alpha2$, $\alpha1+\alpha2$, $-\alpha1+\alpha2$, $-\alpha1-\alpha2$, respectively. In this case, the representative values may be 4 and 2, and 3, 7, −1, −5 may be quantized as (1, −1), (1, 1), (−1, 1), (−1, −1), respectively.

In the aforementioned embodiment, if each of 3, 7, −1, −5 has 32 bits, 132 bits in total are needed before quantization. Meanwhile, if quantization of 1 bit is performed as in FIG. 5D, one representative value of 32 bits and binary data of 4 bits are generated, and thus 36 bits in total are needed. However, if quantization of 2 bits is performed as in FIG. 5E, two representative values of 64 bits and binary data of 8 bits are generated, and thus 72 bits in total are needed. Meanwhile, in the aforementioned embodiment, if quantization of 1 bit is performed, the quantization error is 8, but if quantization of 2 bits is performed, the quantization error is 4. Accordingly, if the compression rate becomes higher, the accuracy may become lower, and if the accuracy becomes higher, the compression rate may become lower.

Figure 5D:
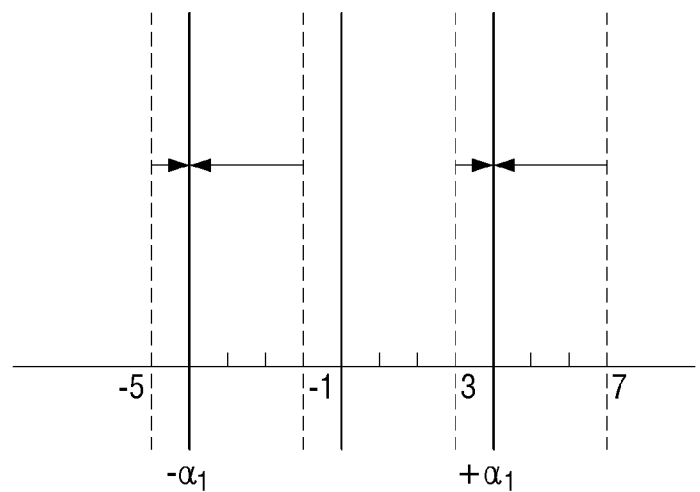
FIG. 5D is a diagram for illustrating a quantization method according to another embodiment of the disclosure.
Figure 5E:
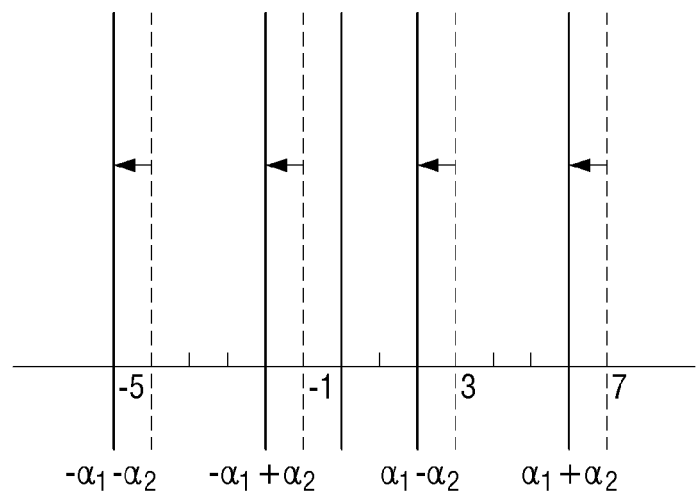
FIG. 5E is a diagram for illustrating a quantization method according to another embodiment of the disclosure.

In FIGS. 5D and 5E, quantization of as much as 2 bits was explained, but the processor 120 may acquire an additional representative value for securing more accuracy. For example, after the processor 120 performs quantization of 2 bits, if the entire quantization error is equal to or greater than a threshold error, the processor 120 may perform quantization again with three representative values. Through such a method, the number of representative values may be determined.

Figure 6A:
FIG. 6A is a diagram for illustrating an advantage according to clustering according to an embodiment.
Figure 6B:
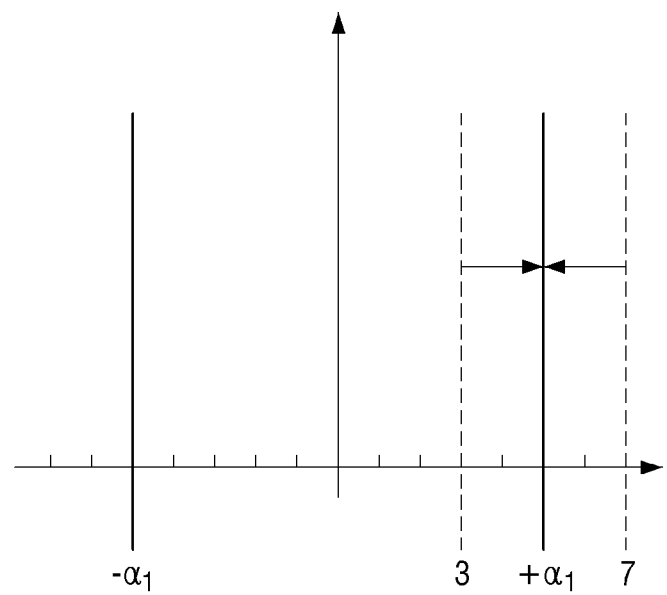
FIG. 6B is a diagram for illustrating an advantage according to clustering according to an embodiment.
Figure 6B:
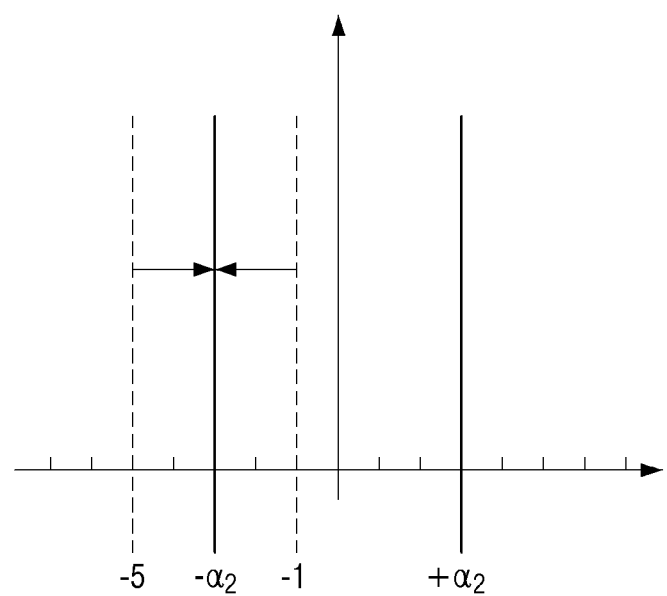

FIGS. 6A and 6B are diagrams for illustrating advantages according to clustering according to an embodiment of the disclosure.

FIG. 6A is a diagram illustrating that the locations of data in the initial matrix have been changed according to clustering. In the same manner as the aforementioned embodiment, it was assumed that the locations of the second group and the third group have been changed, and for the convenience of explanation, explanation will be made only with respect to the first column.

FIG. 6B illustrates a case of performing quantization of 1 bit by grouping the initial matrix without reordering. As may be seen on the top of FIG. 6B, the processor 120 may set $\alpha 1$ as 5 for quantizing the data pairs of the first row and the second row, and may convert the data pairs into 1 and 1. Then, as may be seen on the bottom of FIG. 6B, the processor 120 may set $\alpha 2$ as 3 for quantizing the data pairs of the third row and the fourth row, and may convert the data pairs into 1 and −1.

Figure 6C:
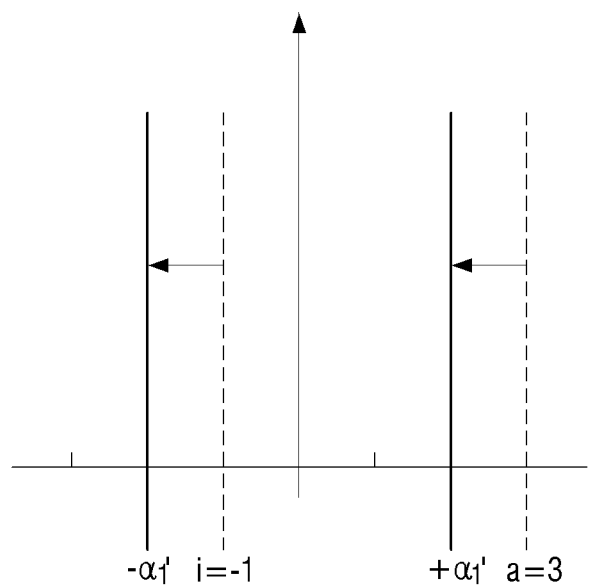
FIG. 6C is a diagram for illustrating a case of performing quantization by using a matrix with reordering.
Figure 6C:
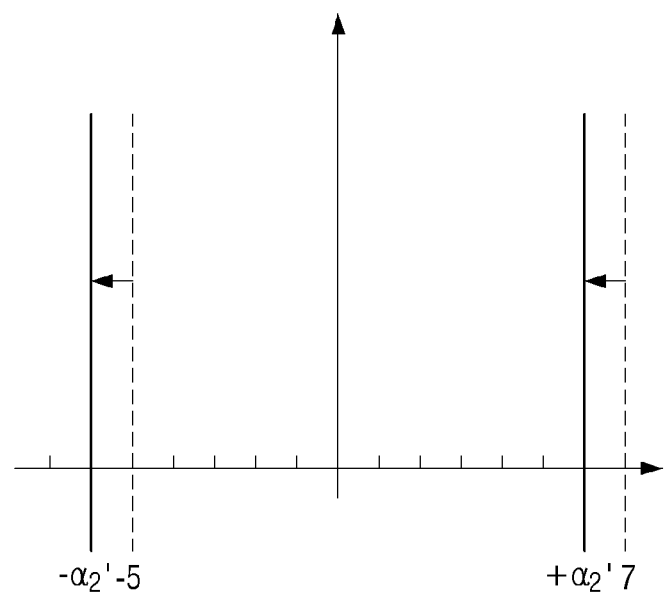

FIG. 6C illustrates a case of performing quantization by using a matrix with reordering. As may be seen on the top of FIG. 6C, the processor 120 may set $\alpha 1'$ as 2 for quantizing the data pairs of the first row and the second row, and may convert the data pairs into 1 and −1. Then, as may be seen on the bottom of FIG. 6C, the processor 120 may set $\alpha 2'$ as 6 for quantizing the data pairs of the third row and the fourth row, and may convert the data pairs into 1 and −1.

The efficiency of quantization may be the same in FIGS. 6B and 6C. Specifically, on the top and the bottom of FIG. 6B, each data of 64 bits is converted into data of 34 bits, and on the top and the bottom of FIG. 6C, each data of 64 bits is also converted into data of 34 bits.

Meanwhile, the quantization error is the difference between the initial data value and the quantized value, and the quantization error is indicated as an arrow in each of FIGS. 6B and 6C. Also, the total lengths of the arrows in FIG. 6C (which is 4) is shorter than the total lengths of the arrows in FIG. 6B (which is 8). That is, the processor 120 may reduce the quantization error by performing clustering, and minimize deterioration of the accuracy of an artificial intelligence model according to quantization.

FIGS. 7A and 7B are diagrams for illustrating additional operations according to clustering according to an embodiment of the disclosure.

FIG. 7A illustrates the order of operating by using the initial matrices without clustering. Specifically, the processor 120 may output X, Y, Z by inputting input data a, b, c into the first matrix, and output final data A, B, C by inputting X, Y, Z into the second matrix.

Meanwhile, if the locations of data of the matrix are changed according to clustering, the processor 120 may realign the output data based on clustering information. Here, the clustering information may be information acquired based on an operation of clustering a plurality of groups into a plurality of clusters.

For example, as illustrated in FIG. 7B, if the location of w12 is changed with the location of w13, the processor 120 may identify that X, Z, Y are output according to the operation of a, b, c and the first matrix, and convert X, Z, Y into X, Y, Z and input X, Y, Z into the second matrix.

Also, in the case of clustering the second matrix after the first matrix, the processor 120 may realign only output of A, B, C of which order is changed according to clustering of the second matrix, and for the output of X, Z, Y of the first matrix operation, the processor 120 may realign the columns of the second matrix according to the order of X, Z, Y and acquire the same result as in the case of converting into X, Y, Z.

FIGS. 8A and 8B are diagrams for illustrating a method of dividing a matrix and quantizing the matrix according to an embodiment of the disclosure.

So far, for convenience of explanation, the quantization method has been explained by using a matrix in a small size. However, in actuality, the size of a matrix may be very large. For example, as illustrated in FIG. 8A, if the number of columns is 10, the distance between a and k may be very close, and thus the quantization efficiency may be high, but the distance between h and r may be far, and thus the quantization efficiency may be low.

Accordingly, as illustrated in FIG. 8B, the processor 120 may divide a matrix into two sub areas based on the columns, and perform clustering and quantization for each sub area. Through such a method, the quantization efficiency may be further improved.

Also, the processor 120 may divide a matrix into a plurality of sub areas by various methods, and improve quantization efficiency and accuracy for each case. In addition, the processor 120 may quantize a matrix by using one of various cases based on quantization efficiency and accuracy.

Meanwhile, since a method of merging operation results is simple arithmetic, detailed explanation in that regard will be omitted.

FIGS. 9A to 9C are diagrams for illustrating a word error rate (WER) and accuracy according to an embodiment of the disclosure.

FIG. 9A describes a WER according to quantizing a matrix, and as the WER becomes lower, the performance becomes better. The table describes the number of clusters, and as the number of the clusters increases, the quantization error is reduced, and thus the WER becomes lower. Also, "Bits" indicate the number of representative values for each cluster, and as the number of representative values increases, the quantization error is reduced more, and thus the WER becomes lower.

FIG. 9B describes a WER according to quantizing a matrix by dividing the matrix into four sub areas, as described in FIG. 8B. In the case of FIG. 9B, the quantization efficiency may be improved more than in the case of FIG. 9A.

FIG. 9C is a drawing describing efficiency according to reordering, and the quantization error is reduced as a K-means algorithm is used, and thus accuracy may be improved. Also, "Num of tables" describes the number of clusters, and as the number of the clusters increases, the quantization error is reduced, and thus accuracy may be improved.

Figure 10A:
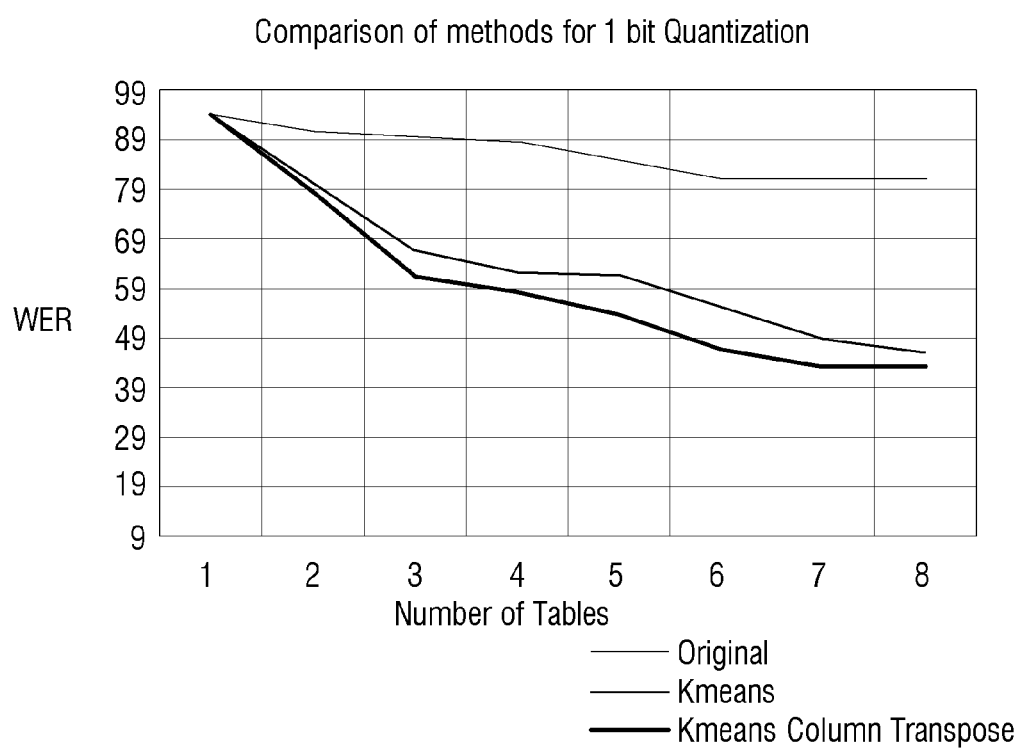
FIG. 10A is a diagram illustrating a WER as a graph according to various embodiments of the disclosure.
Figure 10B:
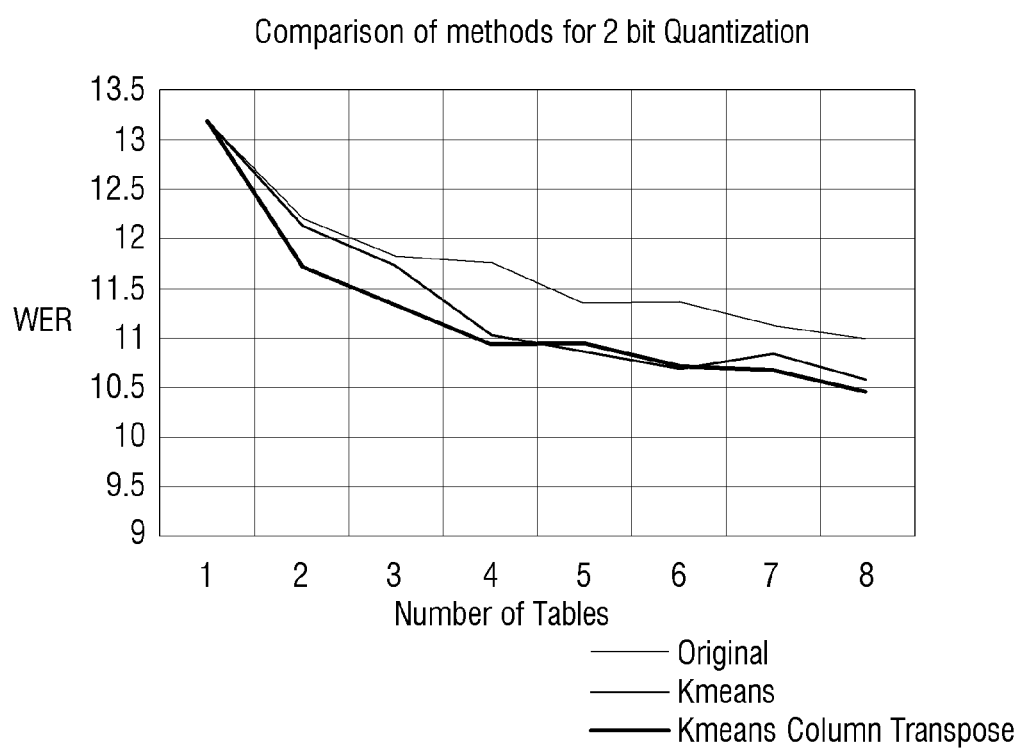
FIG. 10B is a diagram illustrating a WER as a graph according to various embodiments of the disclosure.
Figure 10C:
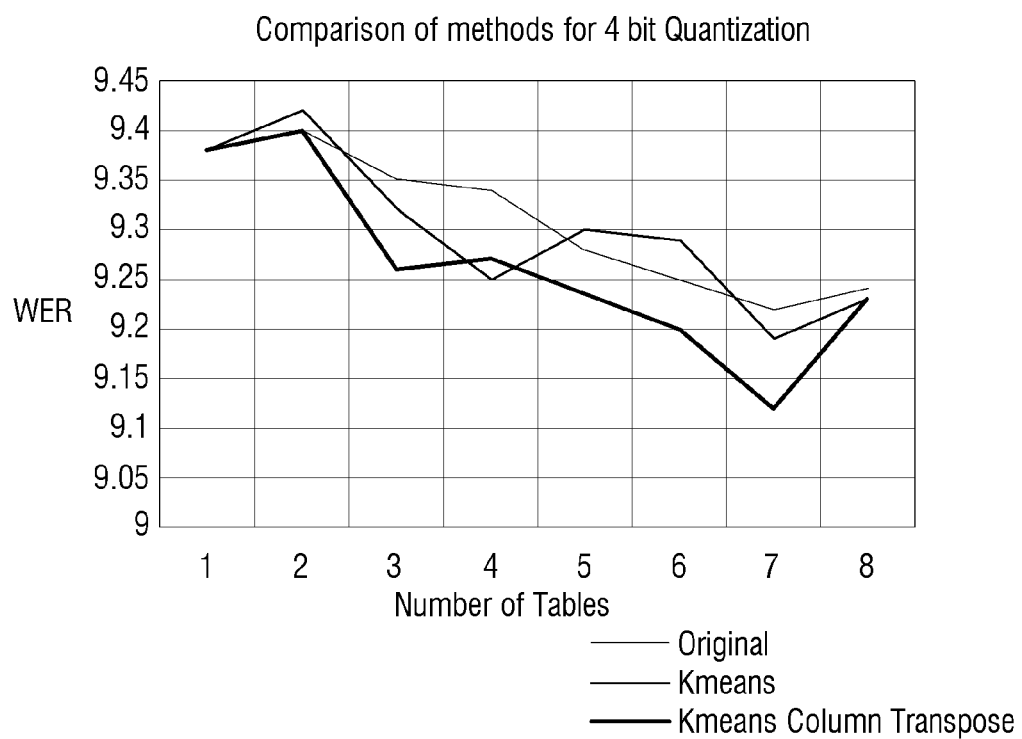
FIG. 10C is a diagram illustrating a WER as a graph according to various embodiments of the disclosure.

FIGS. 10A to 10C are diagrams illustrating a WER as a graph according to various embodiments of the disclosure.

FIGS. 10A to 10C illustrate cases wherein the numbers of representative values for each cluster are 1, 2, 4, respectively, and as the number of representative values increases, the WER may become lower. Also, in each of FIGS. 10A to 10C, as the "Number of Tables" describing the number of the clusters increases, the WER may become lower.

Also, in FIGS. 10A to 10C, a first WER (original) according to a conventional technology, a second WER (Kmeans) after clustering and quantization, and a third WER (Kmeans Column Transpose) after clustering and quantization of each of divided matrices after division of a matrix according to FIG. 8B are described. As shown in FIGS. 10A to 10C, in general, the third WER is lower than the second WER, and the second WER is lower than the first WER, and thus the WER is improved according to the disclosure.

Figure 11:
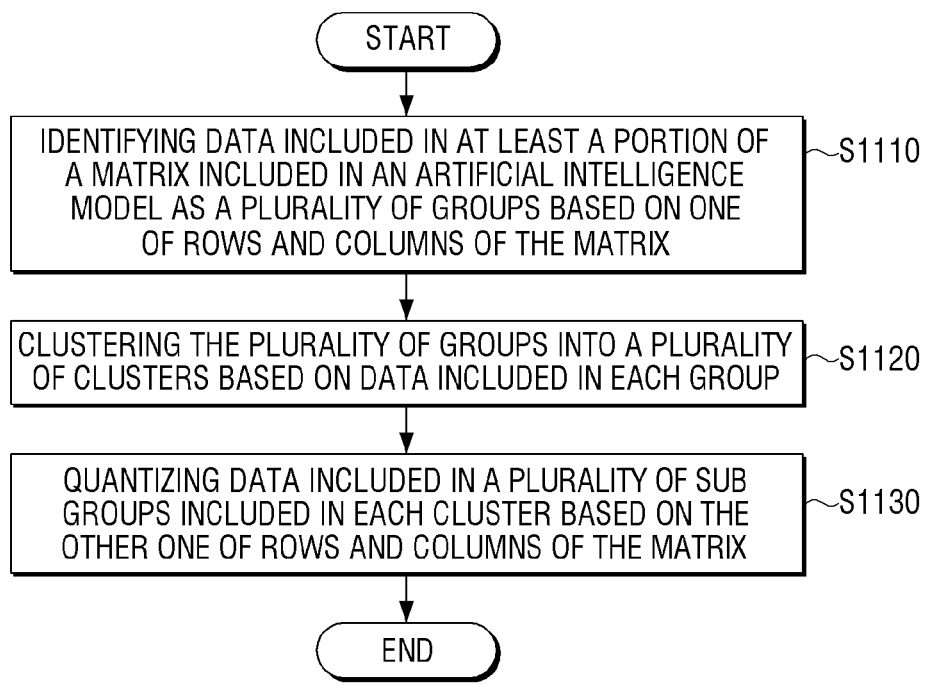
FIG. 11 is a flow chart for illustrating a control method of an electronic apparatus according to an embodiment.

FIG. 11 is a flow chart for illustrating a control method of an electronic apparatus according to an embodiment of the disclosure.

First, data included in at least a portion of a matrix included in an artificial intelligence model is divided by one of rows and columns of the matrix and identified as a plurality of groups at operation S1110. Then, the plurality of groups are clustered into a plurality of clusters based on data included in each of the plurality of groups at operation S1120. Then, data divided by the other one of rows and columns of the matrix is quantized among data included in each of the plurality of clusters at operation S1130.

Here, in the quantizing step S1130, at least one representative value may be acquired based on the size of first data included in a first group and the size of second data included in a second group among groups included in each of the plurality of clusters, and each of the first data and the second data may be converted into a binary code based on the at least one representative value, and each of the first data and the second data may be quantized. Here, the second data may be data wherein the other one of rows and columns of the matrix is the same as that of the first data.

Also, in the quantizing step S1130, the number of the at least one representative value may be determined based on the number of the plurality of groups included in each of the plurality of clusters.

Meanwhile, in the clustering step S1120, each of the plurality of groups may be mapped in a multi-dimensional space based on data included in each of the plurality of groups, and the plurality of groups may be clustered into a plurality of clusters based on the distance among the groups in the multi-dimensional space.

Also, in the clustering step S1120, the plurality of groups may be clustered into a plurality of clusters based on a K-means algorithm.

Meanwhile, a step of, based on acquiring output data for input data based on the quantized matrix, realigning the output data based on clustering information may be further included. Here, the clustering information may be information acquired based on an operation of clustering the plurality of groups into a plurality of clusters.

Meanwhile, at least a portion of the matrix may be a sub area of the matrix identified based on the other one of rows and columns of the matrix.

According to the various embodiments of the disclosure described above, an electronic apparatus may reduce data capacity by quantizing an artificial intelligence model, and at the same time, minimize deterioration in performance by reducing errors due to quantization.

Meanwhile, above, it has been described that one matrix is quantized, but some or all matrices included in an artificial intelligence model may be quantized by the same method.

Also, above, it has been described that the processor performs clustering based on rows, performs quantization based on columns, and divides a matrix into sub areas based on columns, but the disclosure is not limited thereto. For example, the processor may perform clustering based on columns, perform quantization based on rows, and divide a matrix into sub areas based on rows.

Meanwhile, above, only a quantization method according to an alternating multi-bit quantization method has been described, but the same technology may be applied to numerous different quantization methods. That is, in the cases of other quantization methods, data capacity may be reduced through clustering and reordering, and at the same time, deterioration in performance may be minimized by reducing errors due to quantization.

Meanwhile, according to an embodiment of the disclosure, the various embodiments of the disclosure described herein may be implemented as software including instructions stored in machine-readable storage media, which may be read by machines (e.g.: computers). The machines refer to apparatuses that call instructions stored in a storage medium, and may operate according to the called instructions, and the apparatuses may include an electronic apparatus according to the aforementioned embodiments (e.g.: an electronic apparatus A). In case an instruction is executed by a processor, the processor may perform a function corresponding to the instruction by itself, or by using other components under its control. An instruction may include a code that is generated or executed by a compiler or an interpreter. A storage medium that is readable by machines may be provided in the form of a non-transitory storage medium. Here, the term 'non-transitory' only means that a storage medium does not include signals, and is tangible, but does not indicate whether data is stored in the storage medium semi-permanently or temporarily.

Also, according to an embodiment of the disclosure, the method according to the various embodiments described above may be provided while being included in a computer program product. A computer program product refers to a product, and the product may be traded between a seller and a buyer. A computer program product may be distributed on-line in the form of a storage medium that is readable by machines (e.g.: a compact disc read only memory (CD-ROM)), or through an application store (e.g.: play store™). In the case of on-line distribution, at least a portion of a computer program product may be stored in a storage medium such as the server of the manufacturer, the server of the application store, and the memory of the relay server at least temporarily, or may be generated temporarily.

In addition, according to an embodiment of the disclosure, the various embodiments described above may be implemented in a recording medium that may be read by a computer or an apparatus similar to a computer, by using software, hardware, or a combination thereof. In some cases, the embodiments described in this specification may be implemented by a processor itself. According to implementation by software, the embodiments such as processes and functions described in this specification may be implemented by separate software modules. Each of the software modules may perform one or more functions and operations described in this specification.

Meanwhile, computer instructions for performing processing operations of machines according to the aforementioned various embodiments may be stored in a non-transitory computer-readable medium. Computer instructions stored in such a non-transitory computer-readable medium make the processing operations at machines according to the aforementioned various embodiments performed by a specific machine, when the instructions are executed by the processor of the specific machine. A non-transitory computer-readable medium refers to a medium that stores data semi-permanently, and is readable by machines, but not a medium that stores data for a short moment such as a register, a cache, and a memory. As specific examples of a non-transitory computer-readable medium, there may be a CD, a DVD, a hard disk, a blue-ray disk, a USB, a memory card, a ROM and the like.

In addition, each of the components according to the aforementioned various embodiments (e.g.: a module or a program) may consist of a singular object or a plurality of objects. Also, among the aforementioned corresponding sub components, some sub components may be omitted, or other sub components may be further included in the various embodiments. Generally or additionally, some components (e.g.: a module or a program) may be integrated as an object, and perform the functions that were performed by each of the components before integration identically or in a similar manner. A module, a program, or operations performed by other components according to the various embodiments may be executed sequentially, in parallel, repetitively, or heuristically. Or, at least some of the operations may be executed or omitted in a different order, or other operations may be added.

While preferred embodiments of the disclosure have been shown and described so far, the disclosure is not limited to the aforementioned specific embodiments, and it is apparent that various modifications may be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. An electronic apparatus comprising:
a storage storing a matrix included in an artificial intelligence model; and
a processor configured to:
divide data included in at least a portion of the matrix by one of rows and columns of the matrix to form a plurality of groups,
cluster the plurality of groups into a plurality of clusters based on data included in each of the plurality of groups, and
quantize data divided by the other one of rows and columns of the matrix among data included in each of the plurality of clusters.

2. The electronic apparatus of claim 1,
wherein the processor is configured to:
acquire at least one representative value based on a size of first data included in a first group and a size of second data included in a second group among groups included in each of the plurality of clusters, and convert each of the first data and the second data into a binary code based on the at least one representative value, and quantize each of the first data and the second data, and
wherein the second data is data in which the other one of rows and columns of the matrix is a same as that of the first data.

3. The electronic apparatus of claim 2, wherein the processor is configured to:
determine a number of the at least one representative value based on a number of the plurality of groups included in each of the plurality of clusters.

4. The electronic apparatus of claim 1, wherein the processor is configured to:
map each of the plurality of groups in a multi-dimensional space based on data included in each of the plurality of groups, and cluster the plurality of groups into the plurality of clusters based on a distance among the groups in the multi-dimensional space.

5. The electronic apparatus of claim 1, wherein the processor is configured to:
cluster the plurality of groups into the plurality of clusters based on a K-means algorithm.

6. The electronic apparatus of claim 1,
wherein the processor is configured to:
based on acquiring output data for input data based on the quantized matrix, realign the output data based on clustering information, and
wherein the clustering information is acquired based on an operation of clustering the plurality of groups into the plurality of clusters.

7. The electronic apparatus of claim 1,
wherein the at least portion of the matrix is a sub area of the matrix determined based on the other one of rows and columns of the matrix.

8. A control method comprising:
dividing data included in at least a portion of a matrix included in an artificial intelligence model by one of rows and columns of the matrix to form a plurality of groups;
clustering the plurality of groups into a plurality of clusters based on data included in each of the plurality of groups; and
quantizing data divided by the other one of rows and columns of the matrix among data included in each of the plurality of clusters.

9. The control method of claim 8,
wherein the quantizing comprises:
acquiring at least one representative value based on a size of first data included in a first group and a size of second data included in a second group among groups included in each of the plurality of clusters, and converting each of the first data and the second data into a binary code based on the at least one representative value, and quantizing each of the first data and the second data, and
the second data is data wherein the other one of rows and columns of the matrix is a same as that of the first data.

10. The control method of claim 9,
wherein the quantizing comprises:
determining a number of the at least one representative value based on a number of the plurality of groups included in each of the plurality of clusters.

11. The control method of claim 8,
wherein the clustering comprises:
mapping each of the plurality of groups in a multi-dimensional space based on data included in each of the plurality of groups, and clustering the plurality of groups into the plurality of clusters based on a distance among the groups in the multi-dimensional space.

12. The control method of claim 8,
wherein the clustering comprises:
clustering the plurality of groups into the plurality of clusters based on a K-means algorithm.

13. The control method of claim 8, further comprising:
based on acquiring output data for input data based on the quantized matrix, realigning the output data based on clustering information,
wherein the clustering information is acquired based on an operation of clustering the plurality of groups into the plurality of clusters.

14. The control method of claim 8,
wherein the at least portion of the matrix is a sub area of the matrix determined based on the other one of rows and columns of the matrix.

15. An electronic apparatus comprising:
a storage storing a matrix included in an artificial intelligence model; and
a processor configured to:
divide data in the matrix by rows to form a plurality of groups of data,
cluster the plurality of groups into a first cluster and a second cluster based on data included in the plurality of groups, and
quantize the data in the first cluster by columns according to a representative value determined for each column according to the data in the column, and quantize the data in the second cluster by columns according to a representative value determined for each column according to the data in the column.

16. The electronic apparatus of claim 15, wherein the processor is configured to cluster the plurality of groups into the plurality of clusters by reordering at least one of the groups based on the data included in the plurality of groups.

17. The electronic apparatus of claim 15, wherein the representative values for each column of the first cluster are different from one another, and the representative values for each column of the second cluster are different from one another.

18. The electronic apparatus of claim 15, wherein, to quantize data in the first cluster, data from at least two columns is combined, and the combined data is quantized with one representative value.

19. The electronic apparatus of claim 15, wherein a number of the representative values is determined based on a threshold accuracy and/or a threshold quantization error.

* * * * *